United States Patent
Bucklew et al.

(10) Patent No.: US 11,815,538 B2
(45) Date of Patent: *Nov. 14, 2023

(54) SENSOR RECEIVER HAVING A RYDBERG CELL WITH A PLURALITY OF EXCITATION SOURCES AND ASSOCIATED METHODS

(71) Applicant: EAGLE TECHNOLOGY, LLC, Melbourne, FL (US)

(72) Inventors: Victor G. Bucklew, Richmond, VA (US); Jerrod Langston, West Melbourne, FL (US); James Drakes, Occoquan, VA (US); Samuel H. Knarr, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 96 days.

This patent is subject to a terminal disclaimer.

(21) Appl. No.: 17/457,061

(22) Filed: Dec. 1, 2021

(65) Prior Publication Data

US 2023/0059575 A1    Feb. 23, 2023

Related U.S. Application Data

(63) Continuation-in-part of application No. 17/445,316, filed on Aug. 18, 2021, now Pat. No. 11,598,798.

(51) Int. Cl.
*G01R 29/08*    (2006.01)

(52) U.S. Cl.
CPC ..... *G01R 29/0885* (2013.01); *G01R 29/0892* (2013.01)

(58) Field of Classification Search
CPC .................................. G01R 29/0885
USPC ............................................. 324/96
See application file for complete search history.

(56) References Cited

U.S. PATENT DOCUMENTS

| | | | | |
|---|---|---|---|---|
| 4,215,320 A | * | 7/1980 | Chang | H01S 3/227 372/4 |
| 4,604,577 A | * | 8/1986 | Matsumura | G02F 1/0036 359/324 |
| 9,970,973 B2 | | 5/2018 | Anderson et al. | |
| 10,509,065 B1 | * | 12/2019 | Shaffer | G01R 29/0885 |
| 10,605,840 B1 | * | 3/2020 | Amarloo | G01R 29/0885 |
| 10,823,775 B2 | | 11/2020 | Anderson et al. | |

(Continued)

FOREIGN PATENT DOCUMENTS

WO    WO-2010082932 A1 *    7/2010    ........... G01R 33/032

OTHER PUBLICATIONS

Robinson, Amy K., et al. "Determining the angle-of-arrival of a radio-frequency source with a Rydberg atom-based sensor." Applied Physics Letters 118.11 (2021): 114001. (Year: 2021).*

(Continued)

*Primary Examiner* — Christopher P McAndrew
(74) *Attorney, Agent, or Firm* — ALLEN, DYER, DOPPELT, + GILCHRIST, P.A.

(57) ABSTRACT

A sensor receiver may include a Rydberg cell configured to be exposed to a radio frequency (RF) signal, and a probe source configured to generate a plurality of spaced apart pulsed probe beams within the Rydberg cell. The pulsed probe beams may be offset in time from one another. A plurality of excitation sources may be coupled to the Rydberg cell. A detector may be positioned downstream from the Rydberg cell.

26 Claims, 11 Drawing Sheets

(56) References Cited

U.S. PATENT DOCUMENTS

| | | | |
|---|---|---|---|
| 2011/0080580 A1* | 4/2011 | Fermann | G01N 21/65 |
| | | | 372/18 |
| 2011/0080588 A1 | 4/2011 | Fermann et al. | |
| 2013/0027051 A1* | 1/2013 | Ouyang | G01R 31/31728 |
| | | | 324/501 |
| 2019/0187198 A1* | 6/2019 | Anderson | G01R 29/0878 |
| 2020/0096567 A1* | 3/2020 | Diglio | G01R 1/07357 |
| 2020/0136727 A1 | 4/2020 | C. P. M/ | |
| 2020/0161446 A1* | 5/2020 | Anderson | H01L 29/66439 |
| 2020/0233025 A1* | 7/2020 | Salim | G01R 29/0885 |
| 2020/0292606 A1* | 9/2020 | Holloway | G01R 29/0892 |
| 2020/0295838 A1 | 9/2020 | Gordon et al. | |
| 2021/0048465 A1 | 2/2021 | Anderson et al. | |

OTHER PUBLICATIONS

Meyer et al., "Assessment of Rydberg Atoms for Wideband Electric Field Sensing," J. Phys. B: At. Mol. Opt. Phys. 53 034001; Jan. 2020; 16 pages. See Priority U.S. Appl. No. 17/445,316, filed Aug. 18, 2021.

Mohl et al., "Photon Correlation Transients in a Weakly Blockaded Rydberg Ensemble," Journal of Physics B: Atomic, Molecular and Optical Physics; Mar. 2020; pp. 1-7. See Priority U.S. Appl. No. 17/445,316, filed Aug. 18, 2021.

Sapiro et al., "Time Dependence of Rydberg EIT in Pulsed Optical and RF Fields," Journal of Physics B: Atomic, Molecular and Optical Physics; Apr. 2020; pp. 1-10. See Priority U.S. Appl. No. 17/445,316, filed Aug. 18, 2021.

Thaicharoen et al., "Electromagnetically-Induced Transparency, Absorption, and Microwave Field Sensing in a Rb Vapor Cell with a Three-Color All-Infrared Laser System," University of Michigan Department of Physics, Rydberg Technologies, Inc.; May 2019; pp. 1-9. See Priority U.S. Appl. No. 17/445,316, filed Aug. 18, 2021.

Anderson et al., Rydberg atoms for radio-frequency communications and sensing: atomic receivers for pulsed RF field and phase detection, IEEE Age Systems Magazine, Apr. 2020, pp. 48-56.

Abel, "Coherent excitation of ultracold atoms between ground and Rydberg states", Durham University, Aug. 2011, pp. 1-150.

* cited by examiner

SENSOR RECEIVER HAVING A RYDBERG CELL WITH A PLURALITY OF EXCITATION SOURCES AND ASSOCIATED METHODS

PRIORITY APPLICATION(S)

This is a continuation-in-part patent application based upon U.S. patent application Ser. No. 17/445,316 filed Aug. 18, 2021, the disclosure which is hereby incorporated by reference in its entirety.

FIELD OF THE INVENTION

The present invention relates to Rydberg atom-based sensors, and, more particularly, to a sensor receiver that includes a Rydberg cell and related methods.

BACKGROUND OF THE INVENTION

Radio frequency (RF) signals are generated and received in communications, sensing, and intelligence applications across a wide range of commercial markets and government divisions. Emerging RF applications are pushing requirements to higher frequency ranges with new waveforms that are difficult to detect and require RF receivers or sensors that have increased sensitivity. As RF channels become more heavily crowded, there is a desire to push to alternative RF bands spanning from 0 to 100 GHz and beyond. While some RF sensors span multiple bands, most are band-limited and can cover only a few tens of GHz, with a typical upper limit of about 40 GHz, e.g., Ka band. Also, most state-of-the-art RF receivers are not compatible with new waveforms used in emerging distributed sensing networks, new forms of the Global Positioning System (GPS), and new RF applications that are not served with existing narrow band antenna-based receivers. Many state-of-the-art RF receivers and sensors do not have the sensitivity required for these next generation RF applications.

Conventional RF devices that incorporate RF antennas have a high technology readiness level (TRL) and are used in almost every modern RF sensing or communications system. There are limitations with RF antennas, however, because they are Size, Weight and Power (SWaP) limited. The antenna is also on the order of the RF wavelength of radiation, and the RF coverage is over a relatively narrow frequency band, such as 1-10 GHz or 20-40 GHz. Many conventional RF receivers and antenna designs are not compatible with emerging waveforms and may lack sensitivity, making them difficult to cover wide bandwidths, such as 0-100 GHz with high sensitivity.

To address these limitations, Rydberg atom-based RF sensors have been developed, which convert the response of an atomic vapor to incoming RF radiation into measurable changes in an optical probe. These RF sensors provide a new model for RF sensing with increased sensitivity. For example, conventional antennas may provide at most about −130 to −160 dBi (decibels relative to an isotropic radiator), but with Rydberg system sensitivity, it can be up to about 170-180 dBi with a broader range coverage in a single receiver from KHz to THz.

In a Rydberg atom-based RF sensor, the measurement is based upon the attenuation of a probe laser due to absorption in a small room temperature vapor cell filled with alkali atoms, such as rubidium (Rb) or cesium (Cs). Atoms are simultaneously excited into a "Rydberg" state with both a coupling and probe. These Rydberg states are very responsive to local electric fields and the response of the atom to an external electric field, such as an RF signal, alters the measured attenuation of the probe laser and is detected by a probe laser photo detector. The magnitude of the electric field component of the incoming RF radiation may be determined by measuring the spectral splitting of two features in the probe laser absorption spectrum. This may be from Electromagnetically Induced Transparency (EIT) and Autler-Townes (AT) splitting.

Current Rydberg atom-based sensors may have low sampling rates that are set by the slow response time of the atomic system. Current Rydberg atom-based sensors also may be limited by their latency, due to the need for scanning the probe laser across the atomic absorption feature.

SUMMARY OF THE INVENTION

In general, a sensor receiver may include a Rydberg cell configured to be exposed to a radio frequency (RF) signal. A probe source may be configured to generate a plurality of spaced apart pulsed probe beams within the Rydberg cell, with the pulsed probe beams being offset in time from one another. A plurality of excitation sources may be coupled to the Rydberg cell. A detector may be positioned downstream from the Rydberg cell.

In an example, the plurality of excitation sources may comprise a plurality of excitation lasers. The plurality of excitation lasers may have different frequencies, and each of the plurality may comprise a continuous laser. The probe source may be configured to generate the plurality of spaced apart pulsed probe beams without scanning. The probe source may comprise an optical source, and a pulse shaper downstream from the optical source. The probe source may comprise a beam splitter downstream from the pulse shaper, and a respective optical delay element in a path of each beam downstream from the beam splitter. Each optical delay element may comprise a respective different length of optical fiber.

A first microlens may be adjacent a first side of the Rydberg cell, and a second microlens may be adjacent a second side of the Rydberg cell. An excitation source may be coupled to the Rydberg cell. A controller may be coupled to the Rydberg cell, probe source, plurality of excitation sources, and detector. The plurality of excitation sources may be coupled to the Rydberg cell in at one of a counter-propagating direction and co-propagating direction from the probe source.

Another aspect is directed to a method of receiving a radio frequency (RF) signal that may comprise exposing a Rydberg cell to the RF signal; operating a probe source to generate a plurality of spaced apart pulsed probe beams within the Rydberg cell, wherein the pulsed probe beams are offset in time from one another; operating a plurality of excitation sources coupled to the Rydberg cell; and operating a detector downstream from the Rydberg cell.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
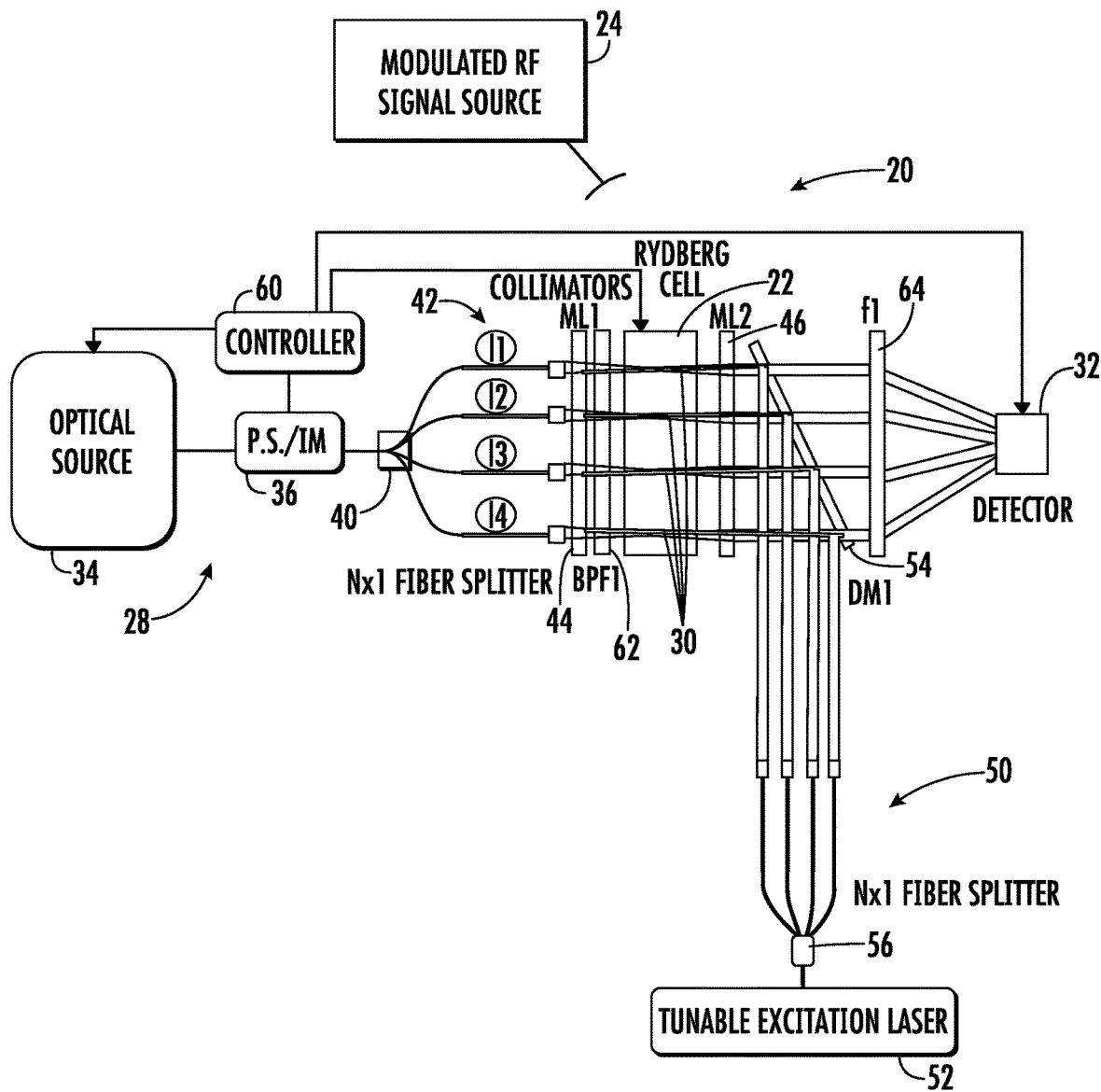
FIG. 1 is a schematic block diagram of the sensor receiver according to the invention.

Referring initially to FIG. 1, a sensor receiver is illustrated generally at 20 and includes a Rydberg cell 22 that is configured to be exposed to a radio frequency (RF) signal generated from a modulated RF signal source 24. This RF signal source 24 may include a non-modulated RF local oscillator. A probe source indicated generally at 28 is configured to generate a plurality of spaced apart pulsed probe beams within the Rydberg cell 22 and generally shown at 30, with the pulsed probe beams being offset in time from one another. It should be understood that one or more Rydberg cells may be used with the probe beams in multiple Rydberg cells. A detector 32 is positioned downstream from the Rydberg cell 22. In an example, the detector 32 is formed from a photodetector cell. The probe source 28 is configured to generate the plurality of spaced apart pulsed probe beams 30 in an example without scanning and may be formed as an optical source 34 and a pulse shaper 36 that is downstream from the optical source. The sensor receiver 20 may work with and without scanning the probe beam. The pulse shaper 36 may be an intensity modulator.

In an example, the probe source 28 includes a beam splitter 40, such as a Nx1 fiber splitter, downstream from the pulse shaper 36 and a respective optical delay element 42 in a path of each beam downstream from the beam splitter. In a non-limiting example, each optical delay element 42 may be formed as a respective different length of optical fiber shown by the loops indicated as L1, L2, L3 and L4. Other delay mechanisms may be used besides fixed pulse delays, such as a changed optical fiber length, such as free space delay elements that may provide more temperature stability and delay tunability. In another non-limiting example, a first microlens 44 is positioned adjacent a first side of the Rydberg cell 22 and a second microlens 46 is positioned adjacent a second side of the Rydberg cell as illustrated by the designations ML1 and ML2.

An excitation source 50 as a coupling laser is coupled to the Rydberg cell 22 and formed, in an example, as a tunable excitation laser 52 and at least one mirror 54, such as a dichroic mirror downstream therefrom to input the output of the excitation laser and excite the rubidium or cesium used within the Rydberg cell 22. For a 4-beam version, as shown in FIG. 1, the Nx1 fiber splitter 56 is a 4×1 splitter and may split the output into four beams from the excitation laser 50 corresponding to the illustrated four probe beams 30. A controller 60 is coupled to the Rydberg cell 22, the optical source 34 as the laser probe of the probe source 28 and detector 32.

As illustrated, a bandpass filter (BPF1) 62 may be included to block the excitation laser 52 and pass the spaced apart probe beams 30. A plano convex lens (f1) 64 may focus the probe beams 30 to the detector 32. The first microlens 44 and bandpass filter 62 may be formed as a collimator device, e.g., a Thorlabs part no. 50-780, and have a collimator output with about a 0.5 mm spot size beam at 780 nanometers as generated from the optical source 34 as a laser.

In an example, the Rydberg cell 22 is a rubidium Rydberg cell, such as Thorlabs part no. GC19075-RB. Other vapors of specific atomic elements may include Cesium (Cs), Potassium (K), Sodium (Na), and possibly Iodine (I). The sensor receiver 20 as illustrated will temporally and spectrally shape the signature of the pulsed probe beams 30, and thus, allows an increase in the sampling rate as proportional to the number of beams "N." Increasing the sampling rate is also dependent on the probe repetition rate. Separating the probe source 28 as a probe laser beam into N distinct pulses, each of which interrogates a distinct volume of the Rydberg cell 22, will increase the sampling of an incoming RF field in proportion to the number of beams "N." In addition to increasing the sampling rate, the bandwidth of the probe pulses may also help reduce the latency usually incurred by scanning the probe beam across the EIT spectrum. This may reduce the latency from about 1 to 2 orders of magnitude. The temporal pulse width of the probe determines its spectral bandwidth through a Fourier transform.

Figure 2:
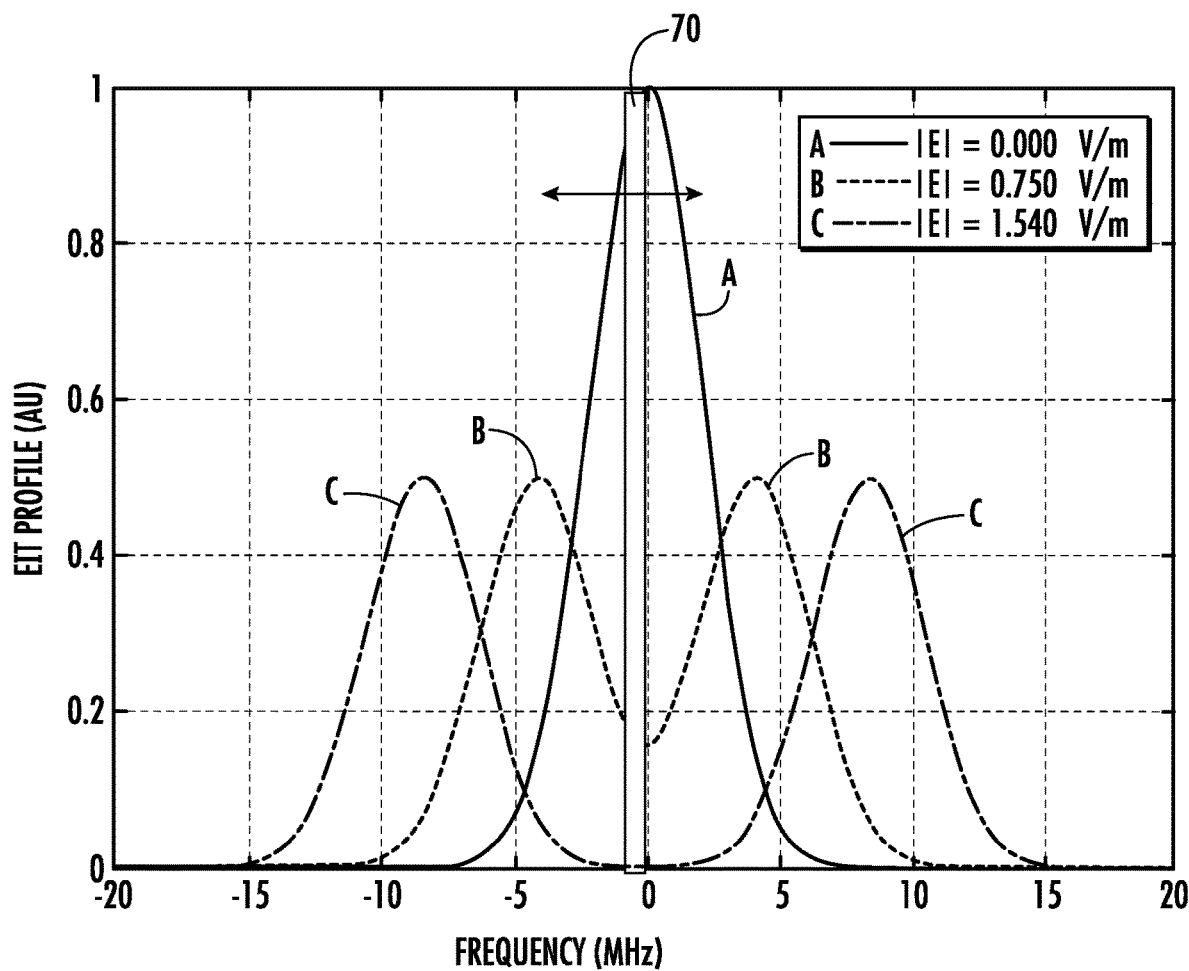
FIG. 2 is a graph showing a comparison between state-of-the-art sweeping of narrow band Rydberg sensor probes and the broadband response for the sensor receiver of FIG. 1.

It is possible to increase the probe bandwidth generated from the optical source 34 from about 100 KHz to about 200 MHz by choosing an appropriate pulse width. The incoming RF field may be mapped onto a spectroscopic fingerprint without scanning. For example, the graph in FIG. 2 shows a large vertical line 70 at 0 MHz frequency corresponding to the large EIT (Electromagnetically Induced Transparency) profile, which is indicative of how a state-of-the-art Rydberg sensor requires scanning of the narrow band probes. The sensor receiver 20 of FIG. 1, however, captures a response directly correlated to the integrated line absorption spectrum, i.e., the equivalent width for the case of the spectral character of the source propagating through the atomic vapor at/near the frequency of an atomic absorption line modified by the pressure of EIT and shown by the range of frequencies labeled A-C and indicative of the 0.0 (A) to 0.750 (B) and 1.540 V/m (C).

Figure 3A:
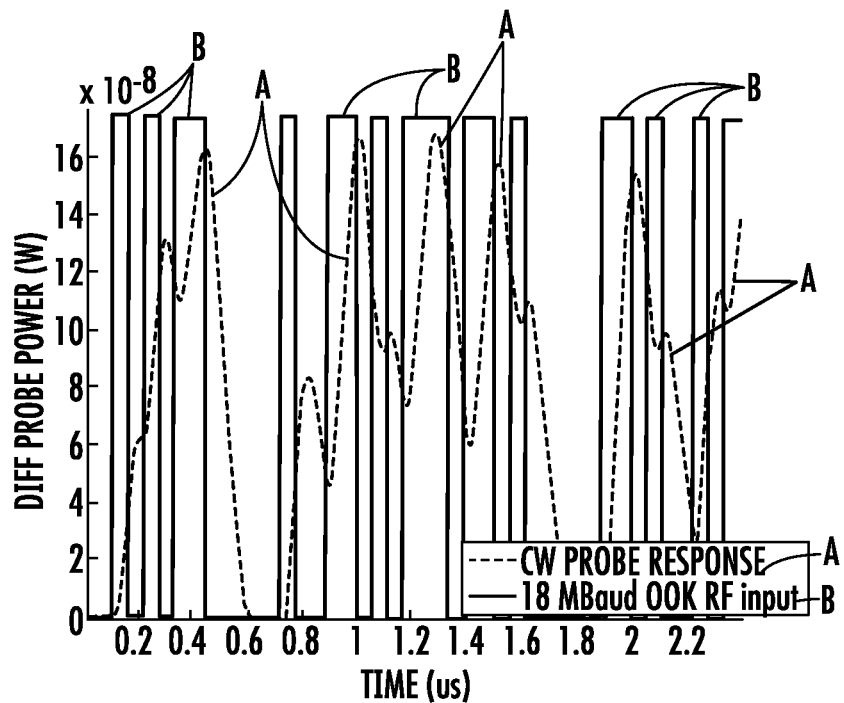
FIG. 3A is a graph showing the differential probe power versus time for a state-of-the-art Rydberg sensor.
Figure 3B:
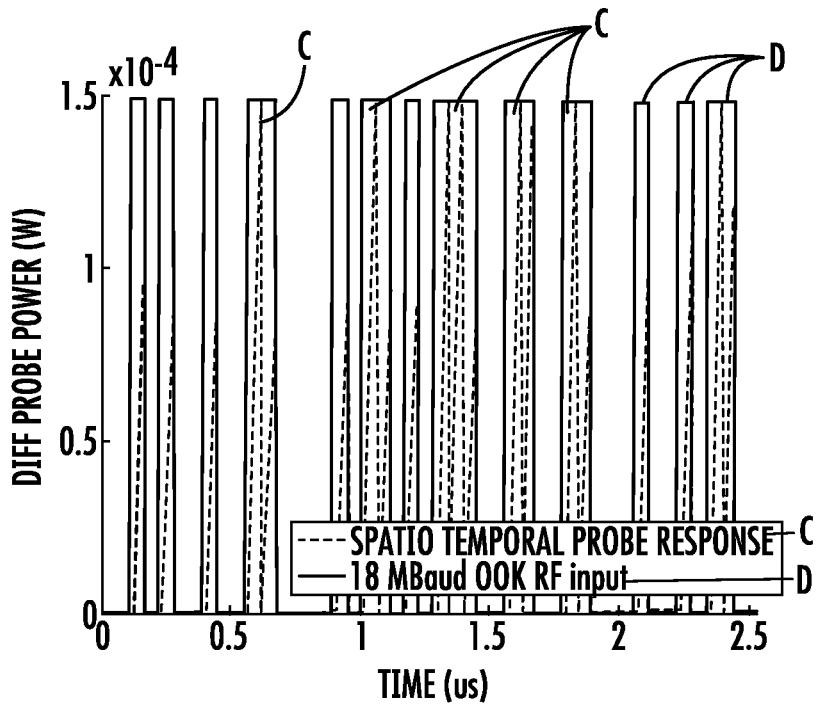
FIG. 3B is a graph similar to that shown in FIG. 3A, but for the sensor receiver of FIG. 1.

Referring now to FIGS. 3A and 3B, there are shown graphs where the state-of-the-art Rydberg sensor continuous wave probe signal shows that the atomic system cannot respond to changes in the external RF signal amplitude faster than its characteristic relaxation time. This is evident in waveforms such as that occurring in "on-off key" or OOK for sufficiently high data rates. This is shown in FIG. 3A, as compared to the sensor receiver 20 of FIG. 1 and where the graph in FIG. 3B shows the spatiotemporally multiplexed probe beam 30 that allows the atomic system to fully recover after it is probed. These two graphs in FIGS. 3A and 3B indicate that the sensor receiver 20 of FIG. 1 enables a higher signal-to-noise readout of higher-speed RF data streams. In these two examples, an 18 MBaud on off keyed (OOK) RF input was simulated.

As shown by the graph in FIG. 3A, corresponding to the state-of-the-art Rydberg sensor, as the RF data rate increases, the performance degrades and the SNR goes down due to the probe response being predominantly limited by preventing the atomic system to relay to equilibrium before the next RF amplitude increase, i.e., its data bit, arrives. On the other hand, as shown in the graph of FIG. 3B, corresponding to the sensor receiver 20 of FIG. 1, as the RF data rate increases, performance does not degrade and the SNR remains at a high value and does not lead to bit errors because the sensor receiver is being probed in its fully recovered state.

Figure 4:
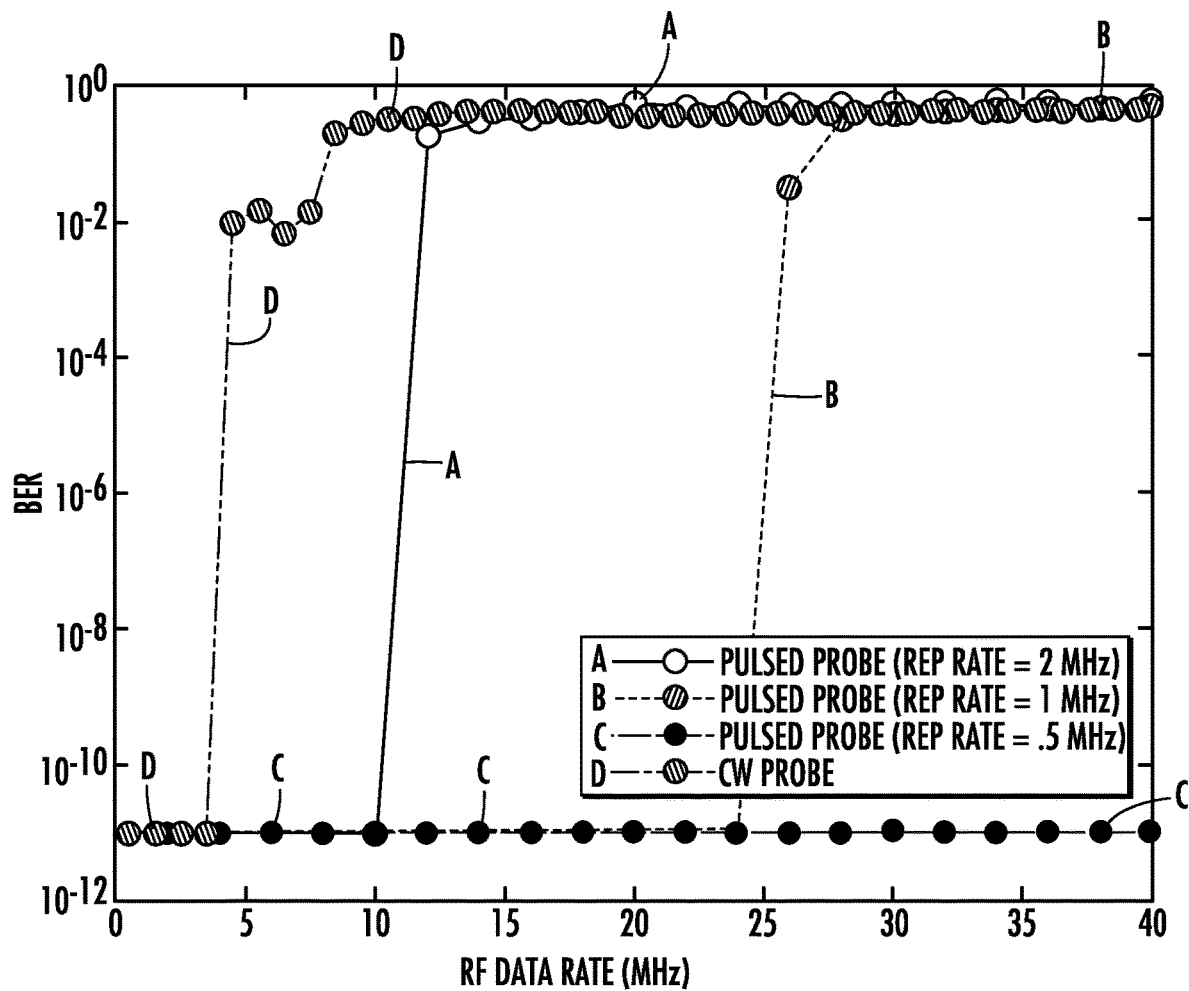
FIG. 4 is a graph comparing a state-of-the-art Rydberg sensor having a continuous wave probe with different pulsed probes of the sensor receiver of FIG. 1.

Referring now to FIG. 4, there is illustrated a graph that compares the bit error rate (BER) on the vertical axis of an RF OOK data stream with different rates for the state-of-the-art Rydberg atom-based sensor corresponding to the CW probe labeled by line D, and the sensor receiver 20 of FIG. 1, having different pulsed probes and a repetition rate of 2 MHz, 1 MHz, and 0.5 MHz shown by respective lines labeled A, B and C. The sensor receiver 20 of FIG. 1 can measure the RF data rates that are 15 times higher than possible with the state-of-the-art Rydberg sensors, for example, as from 3 MHz to 40+ MHz. The CW probe labeled by line D on the graph of FIG. 4 illustrates the state-of-the-art Rydberg sensor, while the pulsed probes labeled A, B and C are examples of the sensor receiver 20 of FIG. 1.

Figure 5A:
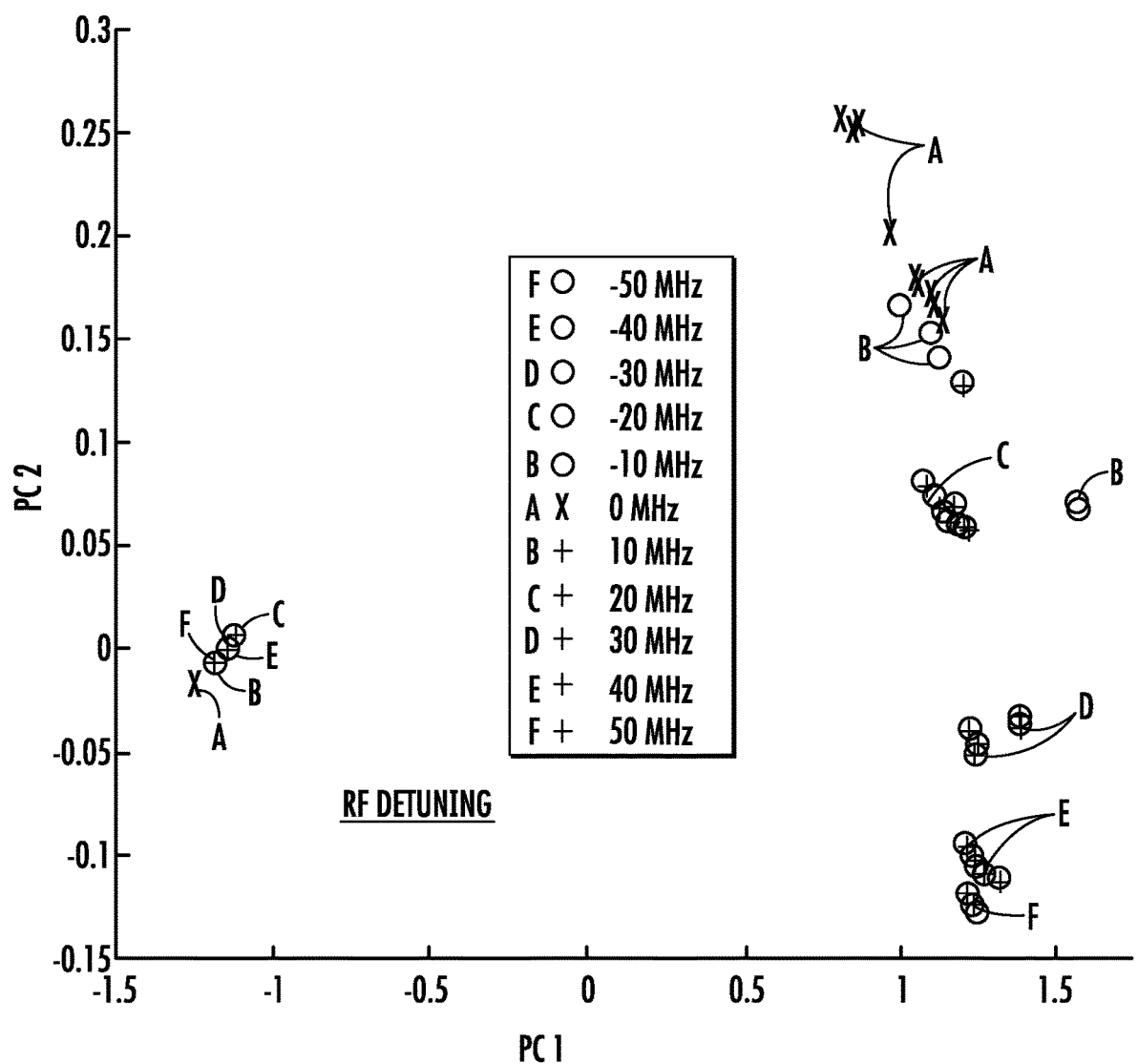
FIG. 5A is a graph showing principal component scores for a state-of-the-art Rydberg sensor.
Figure 5B:
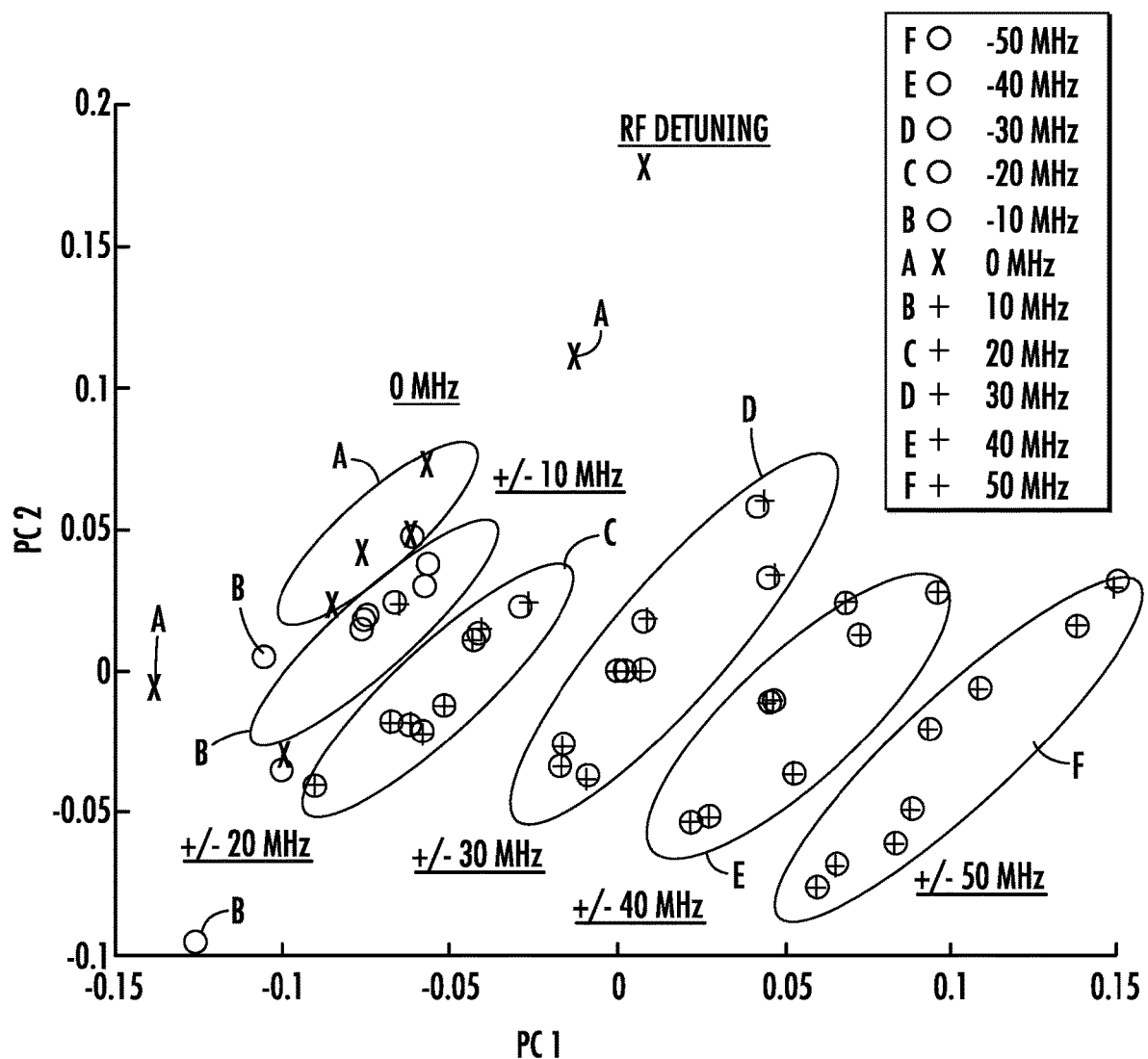
FIG. 5B is a graph showing the principal component scores for the sensor receiver of FIG. 1 showing that the data is separated based upon RF detuning.
Figure 5C:
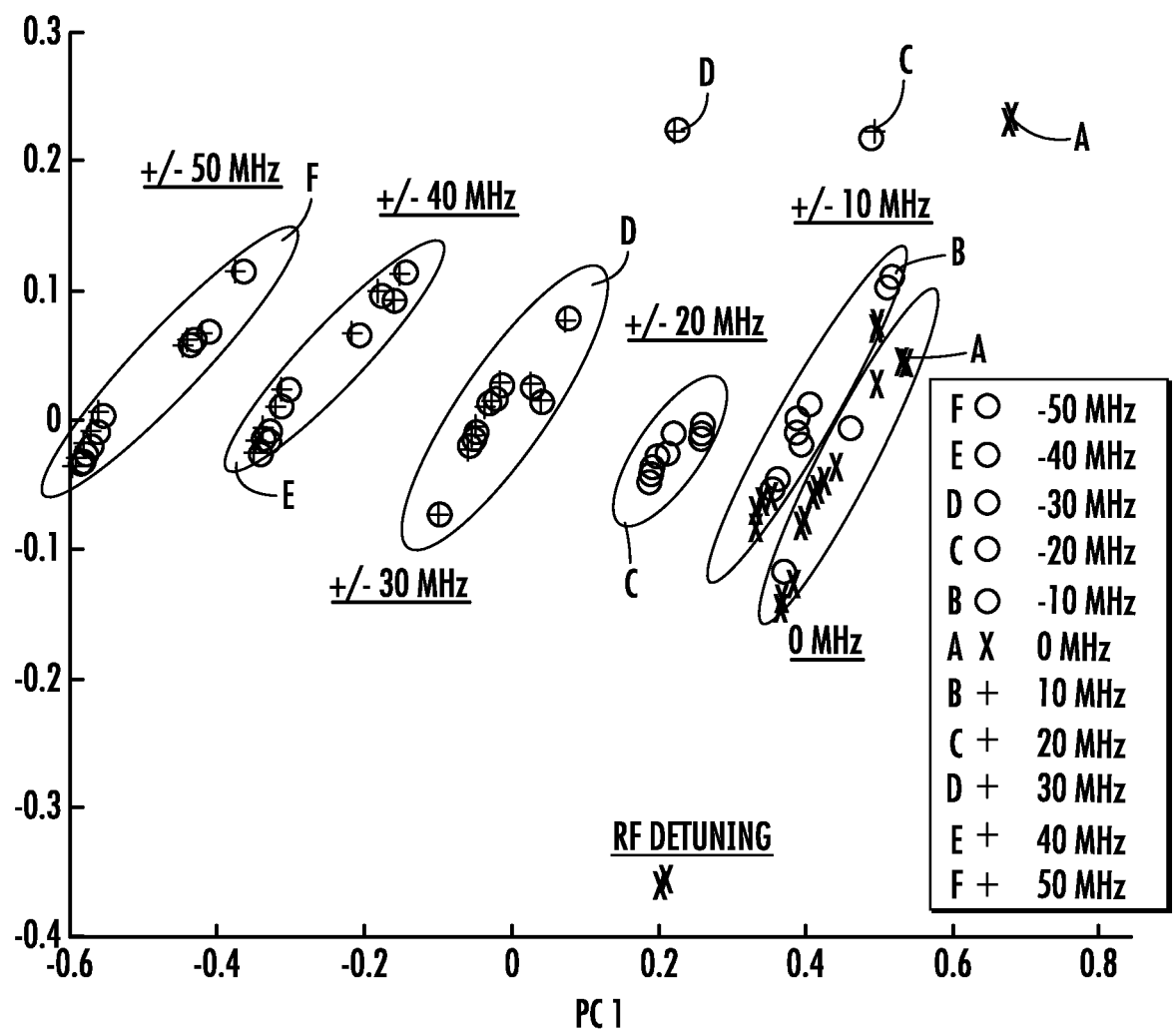
FIG. 5C is a graph showing the principal component scores for a sensor receiver of FIG. 1, but having a larger bandwidth than that sensor receiver of FIG. 5B.

Referring now to FIGS. 5A, 5B and 5C, there are illustrated graphs of how the sensor receiver 20 of FIG. 1 in the graphs of FIGS. 5B and 5C reduces latency and extracts the RF detuning of an incoming RF data stream without scanning the probe laser in comparison with the performance of a state-of-the-art Rydberg sensor as shown in FIG. 5A. FIG. 5B shows a graph of an example of the sensor receiver 20 of FIG. 1 with RF detuning without scanning, and in FIG. 5C with a larger bandwidth of the pulse probes.

As shown in FIG. 5A, based on the narrow spectrum of the continuous wave probe of a state-of-the-art Rydberg sensor, it may be difficult to extract reliable information about the RF detuning without scanning the probe beam from the laser. The two clusters of principal component (PC) scores for each RF detuning are illustrated on the left and the right in FIG. 5A. The left-hand side for the RF detuning at the different frequencies ranging from 0 MHz to +/−50 MHz is indistinguishable, while the right-hand side is more easily distinguishable. In the graph of FIG. 5B, on the other hand, it is evident that with the sensor receiver 20 having the pulsed probe architecture, the RF detuning data can be extracted without scanning the probe laser. The PC scores clearly separate the data based on the RF detuning as shown by the separated frequencies and labeled A-F.

In the graph of FIG. 5C, as the bandwidth of the pulsed probe increases when using the sensor receiver 20 of FIG. 1, there is greater ability to determine information about the RF detuning value. The PC scores between successive RF groups increases as the bandwidth of the probe increases as shown by the comparison of FIGS. 5B and 5C. The state-of-the-art Rydberg sensor as shown with its performance in FIG. 5A uses a probe laser as a continuous wave laser that spectrally scans the absorption feature. The sensor receiver 20 of FIG. 1, however, allows spatial-temporal multiplexing where multiple pulsed beams 30 may be in one Rydberg cell 22. Individual pulses of the probe laser are temporally separated and routed through unique spatial volumes of the Rydberg cell 22 and then recombined photonically prior to photo detection in the detector 32. The pulsed probe leverages the spectral content of the pulse to measure an output that can be correlated through post processing algorithms, to an RF detuning value while simultaneously measuring an incoming RF data stream. Pulsing the probe laser also increases the measurement rate of a single beam's absorption feature by replacing the slower spectral scanning techniques of the state-of-the-art Rydberg sensors.

Figure 6:
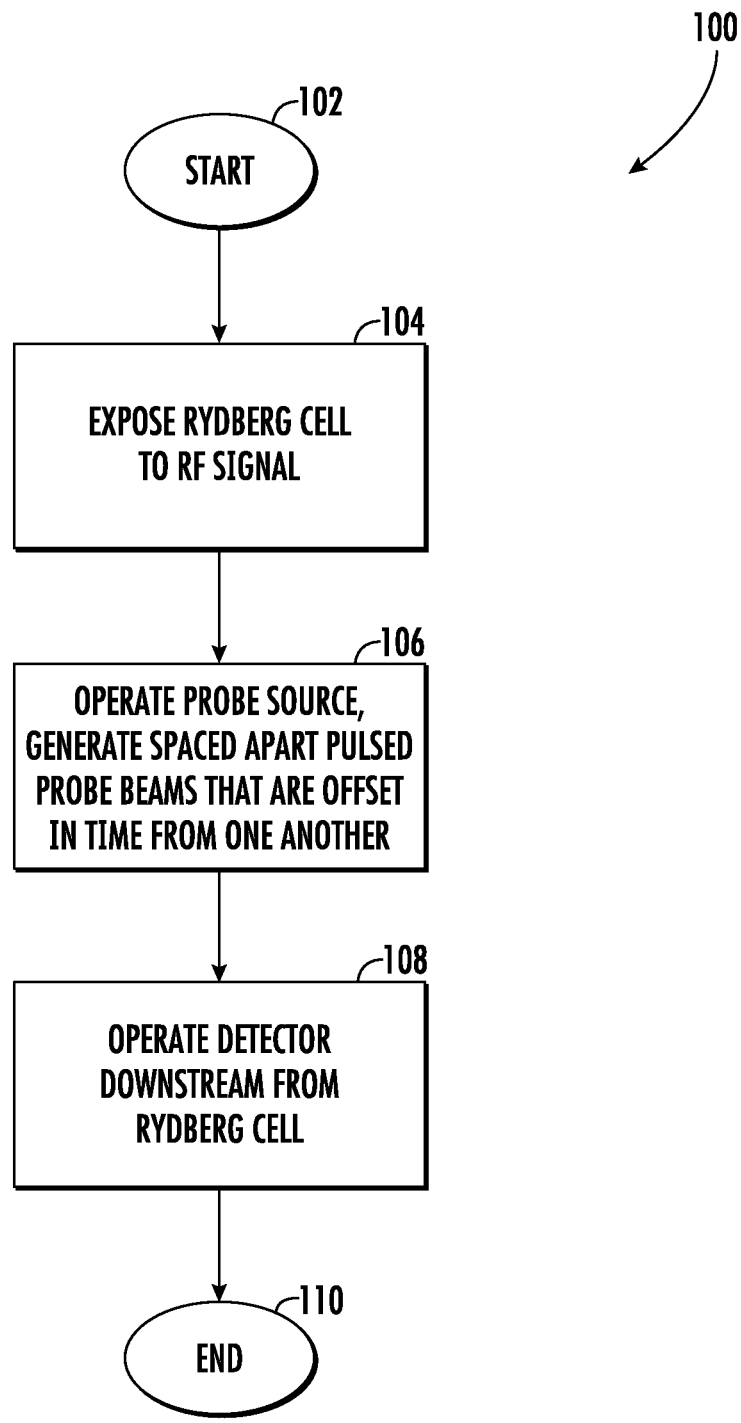
FIG. 6 is a high-level flowchart of a method for receiving an RF signal using the sensor receiver of FIG. 1.

Referring now to FIG. 6, there is illustrated generally at 100 a method for receiving an RF signal using the sensor receiver 20 of FIG. 1. The method starts (Block 102) and the Rydberg cell 22 is exposed to the RF signal (Block 104). The probe source 28 is operated to generate a plurality of spaced apart pulsed probe beams 30 within the Rydberg cell 22, with the pulsed probe beams being offset in time from each other (Block 106). The detector 32 is operated downstream from the Rydberg cell 22 (Block 108) and the process ends (Block 110).

Figure 7:
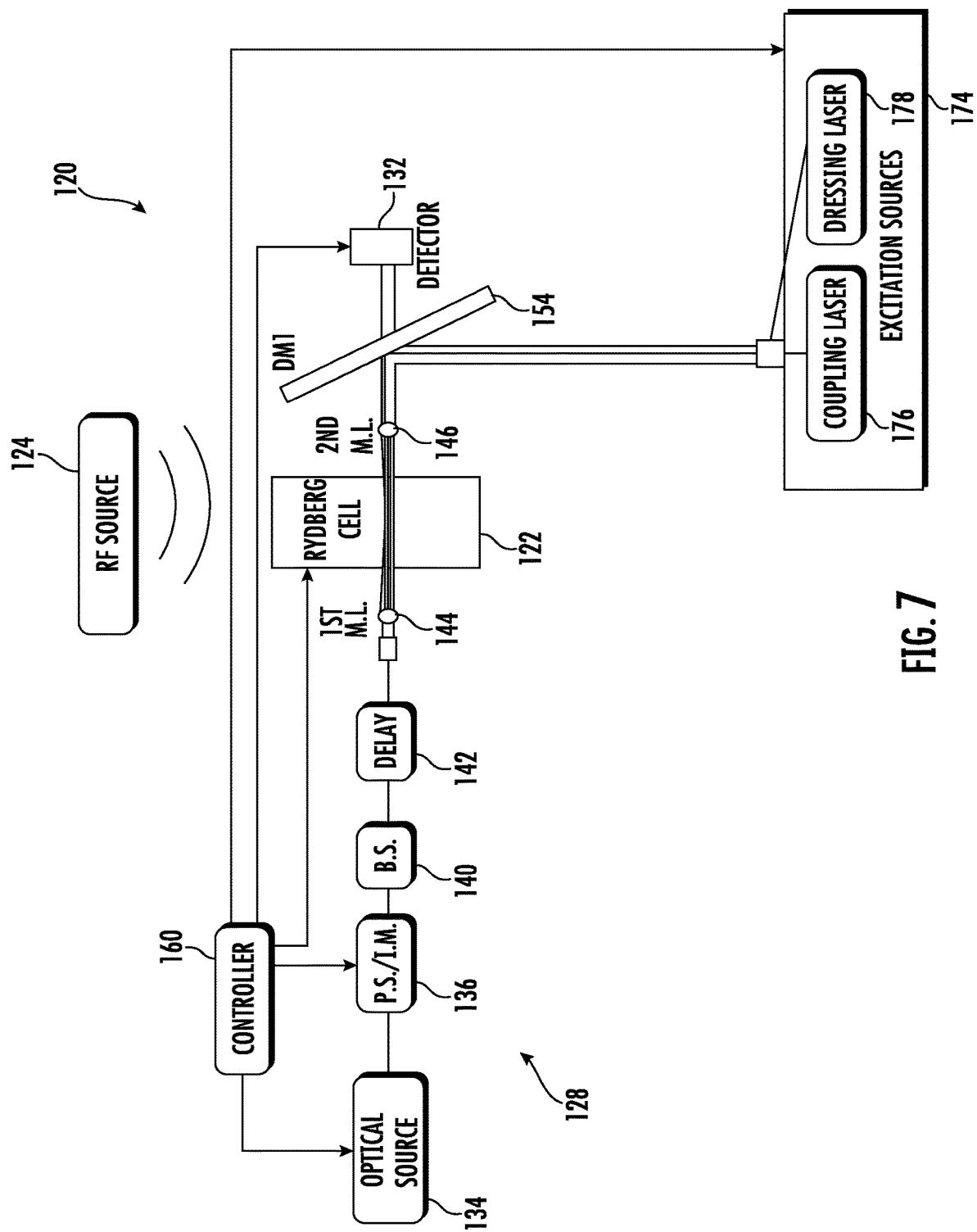
FIG. 7 is a schematic block diagram of the sensor receiver having the plurality of excitation sources according to the invention.

Referring now to FIG. 7, there is illustrated a schematic block diagram of the sensor receiver 120 that incorporates a plurality of excitation sources that are illustrated generally at 174 and include a coupling laser 176 and dressing laser 178. For purposes of description, similar reference numerals describing similar functional components as described relative to the sensor receiver 20 of FIG. 1 are set forth with reference to the description of the sensor receiver 120 of FIG. 7, but using reference numerals in the 100 series.

The sensor receiver 120 includes a Rydberg cell 122 configured to be exposed to a radio frequency (RF) signal shown as the RF source 124. A probe source 128 is configured to generate a plurality of spaced apart pulsed probe beams within the Rydberg cell 122 with the pulsed probe beams being offset and timed from one another. A plurality of excitation sources 174 are coupled to the Rydberg cell 122 in a counter-propagating direction from the probe source 134. A detector 132 is downstream from the Rydberg cell 122.

The plurality of excitation sources 174 may comprise a plurality of excitation lasers illustrated as the coupling laser 176 and dressing laser 178. The excitation lasers 176, 178 may have different frequencies and may each comprise a continuous laser in an example. The probe source 128 may be configured to generate the plurality of spaced apart pulsed probe beams without scanning. The probe source 128 may be formed as an optical source 134, such as a laser, and a pulse shaper 136 is downstream from the optical source. The pulse shaper 136 may include an intensity modulator. The probe source 128 may also include a beam splitter 140 downstream from the pulse shaper 136 and a respective optical delay element 142 in a path of each beam downstream from the beam splitter. In an example, the optical delay element 142 may be formed as respective different lengths of optical fiber. In another example, a first microlens 144 is adjacent a first side of the Rydberg cell 122 and a second microlens 146 is adjacent a second side of the Rydberg cell 122.

The coupling laser 176 and dressing laser 178 may be continuous wave or pulsed and arranged in different configurations with the lasers co-propagating and counter-propagating with each other, and co-propagating and counter-propagating with the probe source 128. Example embodiments for specific transitions may include wavelengths that may change based on the RF frequency that the sensor receiver 120 is configured to detect. For the three laser RF configuration as illustrated in FIG. 7, the coupling laser 176 may be at 1,260 nanometers and may be a pulsed laser beam. The optical source 134 as a laser could operate at 780 nanometers and the dressing laser may operate at 776 nanometers, and both are not pulsed. In another example, the dressing laser 178 could be pulsed and the optical source 134 as a laser and coupling laser 176 are not pulsed. This allows the evolution of atomic populations to maximize the sensitivity that a desired optical beam has to an RF input from the RF source 124.

The controller 160 controls how the individual lasers from the optical source 134, the coupling laser 176 and the dressing laser 178 are operated on or off. The controller 160 may control the direction of each laser 134, 176, 178 through the Rydberg cell 122, and control whether individual lasers are pulsed or not pulsed. Pulse widths may range from 100 picoseconds to the continuous wave. The controller 160 may also control whether the individual lasers 134, 176, 178 are delayed in time relative to each other with delays ranging from 1 nanosecond to 1 microsecond. The coupling laser 176 may be a rubidium laser.

Figure 8:
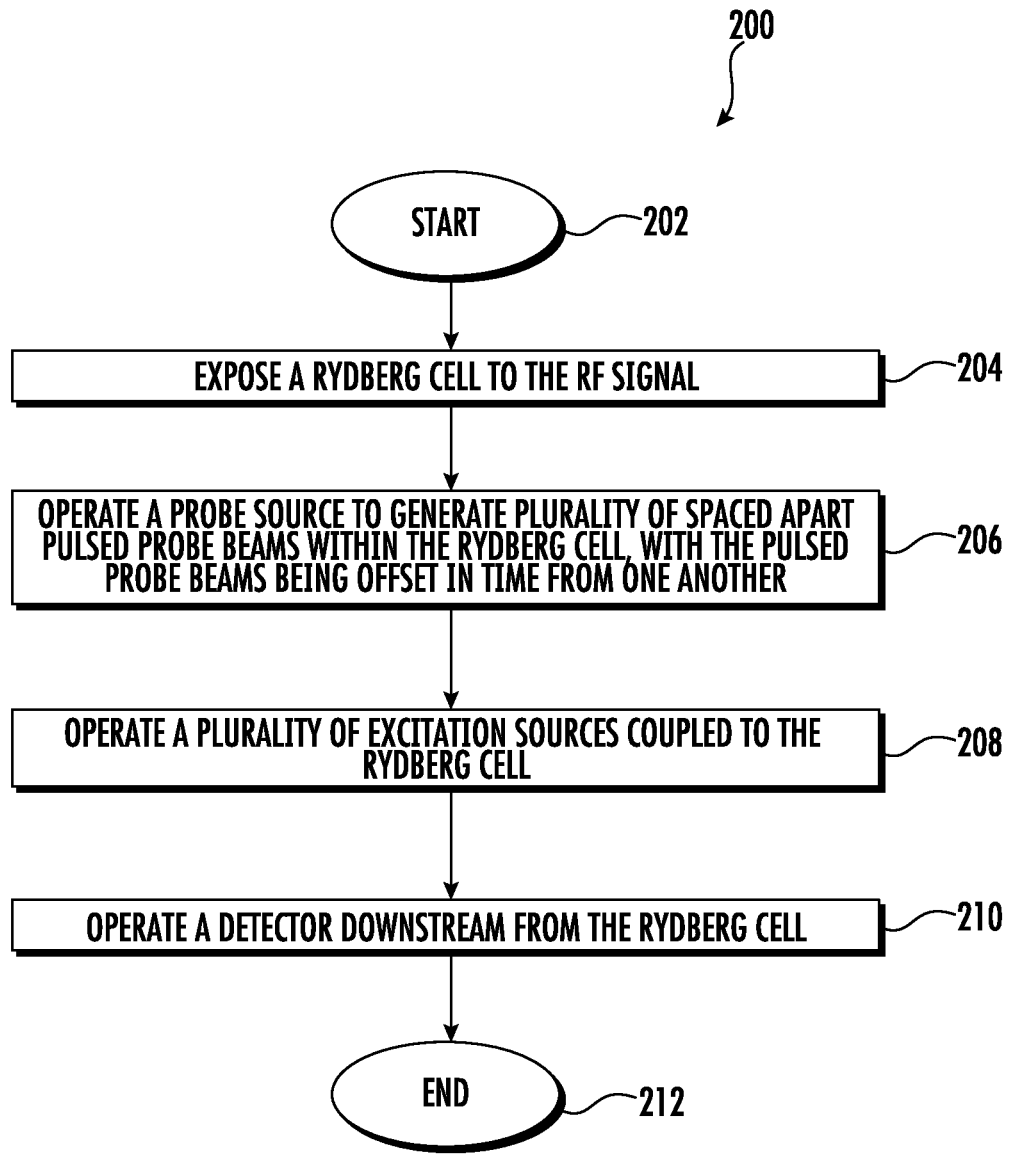
FIG. 8 is a high-level flowchart of a method for receiving an RF signal using the sensor receiver of FIG. 7.

Referring now to FIG. 8, there is illustrated generally at 200 a method for receiving an RF signal using the sensor receiver 120 of FIG. 7. The method starts (Block 202) and the Rydberg cell 122 is exposed to the RF signal (Block 204). The probe source 128 is operated to generate a plurality of spaced apart pulsed probe beams within the Rydberg cell 122, with the pulsed probe beams being offset in time from each other (Block 206). A plurality of excitation sources 174 are coupled to the Rydberg cell 122 (Block 208). A detector 132 is operated downstream from the Rydberg cell 122 (Block 210). The process ends (Block 212).

Figure 9:
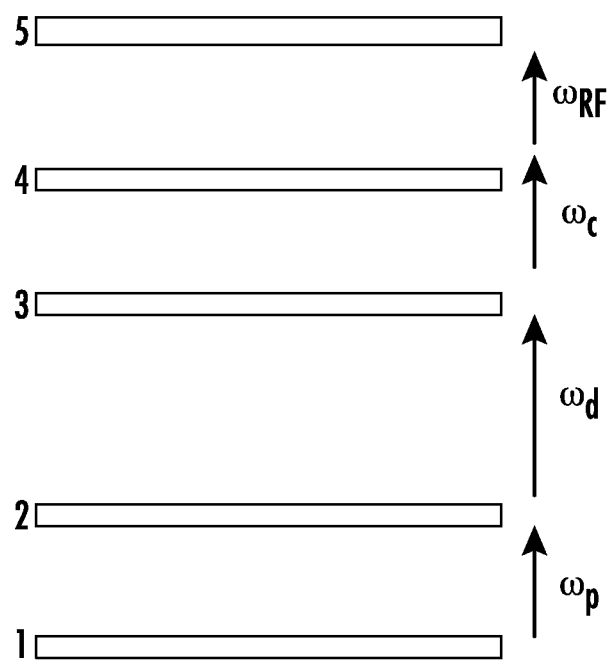
FIG. 9 is a diagram illustrating the different transition energy level states when operating the sensor receiver of FIG. 7.

Referring now to FIG. 9, there are shown five different transition energy level states for the sensor receiver 120 shown in FIG. 7. As illustrated, the atom starts in the ground state $|1\rangle$ and the device applies fields $\omega_p$, $\omega_d$, $\omega_c$, and RF $\omega_{RF}$ to drive dipole transitions $|1\rangle \rightarrow |2\rangle$, $|2\rangle \rightarrow |3\rangle$, $|3\rangle \rightarrow |4\rangle$ and $|4\rangle \rightarrow |5\rangle$ respectively. These beams are referred to as the probe 134, dressing 178, coupling 176, and RF signal 124. The single photon detunings are defined from the exact transition resonances as:

$$\Delta_p = \omega_{21} - \omega_p - k_p v$$

$$\Delta_d = \omega_{32} - \omega_d + k_d v$$

$$\Delta_c = \omega_{43} - \omega_c + k_c v$$

$$\Delta_{RF} = \omega_{54} - \omega_{RF} - k_{RF,\parallel} v$$

where $\omega_{ji}$ is the $|i\rangle \rightarrow |j\rangle$ transition frequency and Doppler shifts have been explicitly included. The two-photon detuning is also defined as $\Delta_2 = \Delta_p + \Delta_d$, the three-photon detuning is defined as $\Delta_3 = \Delta_2 + \Delta_c$, and the four photon detuning is defined as $\Delta_4 = \Delta_3 + \Delta_{RF}$. It should be understood that $|i\rangle \rightarrow |j\rangle$ is a dipole forbidden transition, if i and j have the same parity.

The dipole transition Hamiltonian is given by:

$$H_{dipole} = -\hat{d} \cdot \vec{E}(t) = -\hat{d} \cdot (\vec{E}_p(t) + \vec{E}_d(t) + \vec{E}_c(t) + \vec{E}_{RF}(t))$$

where $\vec{E}_j = E_j \cos(\omega_j t)$. It is possible to expand the dipole operator in terms of the atomic states as:

$$\hat{d} = \sum_{j,l} |j\rangle\langle j|\hat{d}|l\rangle\langle l| = \sum_{j,l} d_{jl}\sigma_{jl}$$

$$j, l \in [1, 2, 3, 4, 5]$$

where the atomic level orthogonal projector operators are defined as $\sigma_{j,i} = |j\rangle\langle l|$. The dipole forbidden transitions have $d_{ij} = 0$. The dipole Hamiltonian is written:

$$H_{dipole} = -\frac{1}{2}\sum_{l,m,k} d_{lm}E_k e^{-i\omega_k t}\sigma_{lm} + h.c.$$

The background atomic Hamiltonian is:

$$H_0 = \Sigma_{i>1}\hbar\omega_{i,1}\sigma_{ii}.$$

In writing the atomic Hamiltonian this way, all the transition frequencies are relative to the ground state. This form currently allows for non-energy conserving transitions such as $\omega_c$ pumping from level 1 to 2, or any single beam driving the (dipole allowed) transition 1 to 4. These terms can be removed such that:

$$H_{dipole} = \frac{-\hbar}{2}\left(\Omega_p \sigma_{21}\left(e^{-i\omega_p t} + e^{i\omega_p t}\right) + \Omega_d \sigma_{32}\left(e^{-i\omega_d t} + e^{i\omega_d t}\right) + \right.$$
$$\left. \Omega_c \sigma_{43}\left(e^{-i\omega_c t} + e^{i\omega_c t}\right) + \Omega_{RF}\sigma_{54}\left(e^{-i\omega_{RF} t} + e^{i\omega_{RF} t}\right) + h.c\right)$$

where the Rabi frequency is $$\Omega_j = \frac{dE_j(t)}{\hbar}.$$

The Rabi frequency is not the transition frequency, but is associated with the transition rate between the two levels. It is possible to simplify later calculations by moving into a rotating frame using the unitary transform:

$$R = |1\rangle\langle 1| + e^{i\omega_p t}|2\rangle\langle 2| + e^{i(\omega_p + \omega_d)t}|3\rangle\langle 3|$$
$$\langle 3| + e^{i(\omega_p + \omega_c + \omega_d)t}|4\rangle\langle 4| + e^{i(\omega_p + \omega_c + \omega_d + \omega_{RF})t}|5\rangle\langle 5|.$$

The interaction dynamics come from the equation of motion:

$$\frac{d\rho}{dt} = \frac{1}{i\hbar}[H, \rho]$$

where the density matrix $\rho = \Sigma_{i,j}\rho_{ij}(t)\sigma_{ij}$. It is possible to transform to the rotating frame by inserting:

$$\frac{d}{dt}R^+ R \rho R^+ R = \frac{1}{i\hbar}(R^+ RHR^+ R\rho R^+ R - R^+ R\rho R^+ RHR^+ R).$$

Identifying $\rho \rightarrow R\rho R^+$, $H \rightarrow RHR^+$ and dropping the fast oscillating terms, the full Hamiltonian is given by:

$$H = \hbar\Delta_p\sigma_{22} + \hbar\Delta_2\sigma_{33} + \hbar\Delta_3\sigma_{44} +$$
$$\hbar\Delta_4\sigma_{55} + \frac{-\hbar}{2}(\Omega_p\sigma_{21} + \Omega_d\sigma_{32} + \Omega_c\sigma_{43} + \Omega_{RF}\sigma_{54} + h.c).$$

This equation fails to capture any damping effects from spontaneous emission or dephasing. These effects can be added in by including the terms:

$$\frac{d\rho}{dt} = \frac{1}{i\hbar}[H, \rho] + \frac{1}{2}\sum_{i>j}\Gamma_{ij}(2\sigma_{ji}\rho\sigma_{ij} - \sigma_{ii}\rho - \rho\sigma_{ii}) + \frac{1}{2}\sum_{i>1}\gamma_i(2\sigma_{ii}\rho\sigma_{ii} - \sigma_{ii}\rho - \rho\sigma_{ii})$$

Here $\Gamma_{ij}$ gives the rate of spontaneous decay from level i to level j, and $\gamma_i$ are energy conserving dephasing terms. The effect of the RF field can be observed through the transmission of the probe beam through the medium. The intensity of the probe beam after propagating through a distance L of the atomic medium is:

$$I = I_0 e^{\frac{-2\pi Im[\chi^1(\omega_p)]}{\lambda_p}L}.$$

The linear susceptibility $\chi^{(1)}(\omega_p)$ relates the linear polarization of the medium to the applied electric field. It is possible to assume that all the fields have the same polarization:

$$p^{(1)}(t) = N\langle p(t)\rangle = NTr[\hat{d}\rho] = N\sum_{ij}(d_{ij}\rho_{ji}(t)e^{-i\omega_p t} + c.c.) =$$

$$\epsilon_0\sum_l(\chi^{(1)}(\omega_l)(E_l(\omega_l)e^{-i\omega_l t} + c.c.)) \to \chi^{(1)}(\omega_p) = \frac{N}{\epsilon_0 E_p}d_{12}\rho_{21}$$

where N is the atomic number density and $\langle\vec{\rho}(t)\rangle$ is the electric dipole moment. To find $\chi^{(1)}(\omega_p)$, the density matrix elements that oscillate at $\omega_p$ should first be found.

To simplify the equations, the following groupings may be made (note since $\Gamma_{ij}=\Gamma_{ji}$, $\gamma_{ij}=\gamma_{ji}$):

$$\gamma_{21} = \frac{1}{2}(\Gamma_{21} + \gamma_2)$$

$$\gamma_{31} = \frac{1}{2}(\Gamma_{32} + \Gamma_{31} + \gamma_3)$$

$$\gamma_{41} = \frac{1}{2}(\Gamma_{41} + \Gamma_{42} + \Gamma_{43} + \gamma_4)$$

$$\gamma_{51} = \frac{1}{2}(\Gamma_{51} + \Gamma_{52} + \Gamma_{53} + \Gamma_{54} + \gamma_5)$$

$$\gamma_{32} = \frac{1}{2}(\Gamma_{21} + \Gamma_{31} + \Gamma_{32} + \gamma_2 + \gamma_3)$$

$$\gamma_{42} = \frac{1}{2}(\Gamma_{21} + \Gamma_{41} + \Gamma_{42} + \Gamma_{43} + \gamma_2 + \gamma_4)$$

$$\gamma_{43} = \frac{1}{2}(\Gamma_{31} + \Gamma_{32} + \Gamma_{41} + \Gamma_{42} + \Gamma_{43} + \gamma_3 + \gamma_4)$$

$$\gamma_{52} = \frac{1}{2}(\Gamma_{21} + \Gamma_{51} + \Gamma_{52} + \Gamma_{53} + \Gamma_{54} + \gamma_2 + \gamma_5)$$

$$\gamma_{53} = \frac{1}{2}(\Gamma_{31} + \Gamma_{32} + \Gamma_{51} + \Gamma_{52} + \Gamma_{53} + \Gamma_{54} + \gamma_3 + \gamma_5)$$

$$\gamma_{54} = \frac{1}{2}(\Gamma_{41} + \Gamma_{42} + \Gamma_{43} + \Gamma_{51} + \Gamma_{52} + \Gamma_{53} + \Gamma_{54} + \gamma_4 + \gamma_5)$$

Also, it is possible to assume that all the Rabi frequencies are real $\Omega_i = \Omega^*_i$, $$\dot{\rho}_{11} = -\frac{i\Omega_p}{2}(\rho_{12} - \rho_{21}) + \Gamma_{21}\rho_{22} + \Gamma_{31}\rho_{33} + \Gamma_{41}\rho_{44} + \Gamma_{51}\rho_{55}$$

$$\dot{\rho}_{22} = \frac{i\Omega_p}{2}(\rho_{12} - \rho_{21}) - \frac{i\Omega_d}{2}(\rho_{23} - \rho_{32}) - \Gamma_{21}\rho_{22} + \Gamma_{32}\rho_{33} + \Gamma_{42}\rho_{44} + \Gamma_{52}\rho_{55}$$

$$\dot{\rho}_{33} = \frac{i\Omega_d}{2}(\rho_{23} - \rho_{32}) - \frac{i\Omega_c}{2}(\rho_{34} - \rho_{43}) - (\Gamma_{31} + \Gamma_{32})\rho_{33} + \Gamma_{43}\rho_{44} + \Gamma_{53}\rho_{55}$$

$$\dot{\rho}_{44} = \frac{i\Omega_c}{2}(\rho_{34} - \rho_{43}) - \frac{i\Omega_c}{2}(\rho_{34} - \rho_{43}) -$$

$$\frac{i\Omega_{RF}}{2}(\rho_{45} - \rho_{54}) - (\Gamma_{41} + \Gamma_{42} + \Gamma_{43})\rho_{44} + \Gamma_{54}\rho_{55}$$

$$\dot{\rho}_{55} = \frac{i\Omega_{RF}}{2}(\rho_{45} - \rho_{54}) - (\Gamma_{51} + \Gamma_{52} + \Gamma_{53} + \Gamma_{54})\rho_{55}$$

$$\dot{\rho}_{21} = -\frac{i}{2}\Omega_p(\rho_{22} - \rho_{11}) + \frac{i}{2}\Omega_d\rho_{31} - (\gamma_{21} + i\Delta_p)\rho_{21}$$

$$\dot{\rho}_{32} = -\frac{i}{2}\Omega_d(\rho_{33} - \rho_{22}) - \frac{i}{2}\Omega_p\rho_{31} + \frac{i}{2}\Omega_c\rho_{42} - (\gamma_{32} + i\Delta_d)\rho_{32}$$

$$\dot{\rho}_{31} = -\frac{i}{2}\Omega_p\rho_{32} + \frac{i}{2}\Omega_d\rho_{21} + \frac{i}{2}\Omega_c\rho_{41} - (\gamma_{31} + i\Delta_2)\rho_{31}$$

$$\dot{\rho}_{41} = -\frac{i}{2}\Omega_p\rho_{42} + \frac{i}{2}\Omega_c\rho_{31} + \frac{i}{2}\Omega_{RF}\rho_{51} - (\gamma_{41} + i\Delta_3)\rho_{41}$$

$$\dot{\rho}_{42} = -\frac{i}{2}\Omega_d\rho_{43} - \frac{i}{2}\Omega_p\rho_{41} + \frac{i}{2}\Omega_c\rho_{32} + \frac{i}{2}\Omega_{RF}\rho_{52} - (\gamma_{42} + i(\Delta_c + \Delta_d))\rho_{42}$$

$$\dot{\rho}_{43} = -\frac{i}{2}\Omega_c(\rho_{44} - \rho_{33}) - \frac{i}{2}\Omega_d\rho_{42} + \frac{i}{2}\Omega_{RF}\rho_{53} - (\gamma_{43} + i\Delta_c)\rho_{43}$$

$$\dot{\rho}_{51} = -\frac{i}{2}\Omega_p\rho_{52} + \frac{i}{2}\Omega_{RF}\rho_{41} - (\gamma_{51} + i\Delta_4)\rho_{51}$$

$$\dot{\rho}_{52} = -\frac{i}{2}\Omega_d\rho_{53} - \frac{i}{2}\Omega_p\rho_{51} + \frac{i}{2}\Omega_{RF}\rho_{42} - (\gamma_{52} + i(\Delta_4 - \Delta_p))\rho_{52}$$

$$\dot{\rho}_{53} = -\frac{i}{2}\Omega_c\rho_{54} - \frac{i}{2}\Omega_d\rho_{52} + \frac{i}{2}\Omega_{RF}\rho_{43} - (\gamma_{53} + i(\Delta_4 - \Delta_2))\rho_{53}$$

$$\dot{\rho}_{54} = -\frac{i}{2}\Omega_{RF}(\rho_{55} - \rho_{44}) - \frac{i}{2}\Omega_c\rho_{53} - (\gamma_{54} + i\Delta_{RF})$$

These equations can be reorganized into the matrix equation:

$$\dot{\vec{\rho}} = A\vec{\rho}$$

where A is a coefficient matrix and $\vec{\rho} = \rho_{ij}$. The steady state solution is obtained by setting $\dot{\vec{\rho}} = 0$ and numerically solving for the null space of A.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:
1. A sensor receiver comprising:
   a Rydberg cell configured to be exposed to a radio frequency (RF) signal;
   a probe source configured to generate a plurality of spaced apart pulsed probe beams within the Rydberg cell, with the pulsed probe beams being offset in time from one another;

a plurality of excitation sources coupled to the Rydberg cell; and a detector downstream from the Rydberg cell.

2. The sensor receiver of claim 1, wherein the plurality of excitation sources comprise a plurality of excitation lasers.

3. The sensor receiver of claim 2, wherein the plurality of excitation lasers have different frequencies.

4. The sensor receiver of claim 2, wherein each of the plurality of excitation lasers comprises a continuous laser.

5. The sensor receiver of claim 1, wherein the probe source is configured to generate the plurality of spaced apart pulsed probe beams without scanning.

6. The sensor receiver of claim 1, wherein the probe source comprises an optical source, and a pulse shaper downstream from the optical source.

7. The sensor receiver of claim 6, wherein the probe source comprises a beam splitter downstream from the pulse shaper, and a respective optical delay element in a path of each beam downstream from the beam splitter.

8. The sensor receiver of claim 7, wherein each optical delay element comprises a respective different length of optical fiber.

9. The sensor receiver of claim 1, comprising a first microlens adjacent a first side of the Rydberg cell, and a second microlens adjacent a second side of the Rydberg cell.

10. The sensor receiver of claim 1, comprising a controller coupled to the Rydberg cell, probe source, plurality of excitation sources, and detector.

11. The sensor receiver of claim 1, wherein the plurality of excitation sources are coupled to the Rydberg cell in at least one of a counter-propagating direction and co-propagating direction from the probe source.

12. A sensor receiver comprising:

a Rydberg cell configured to be exposed to a radio frequency (RF) signal;

a probe source comprising an optical source, and a pulse shaper downstream therefrom and configured to generate a plurality of non-scanned, spaced apart, pulsed probe beams within the Rydberg cell, with the non-scanned, spaced apart, pulsed probe beams being offset in time from one another;

a plurality of excitation lasers coupled to the Rydberg cell; and a detector downstream from the Rydberg cell.

13. The sensor receiver of claim 12, wherein the plurality of excitation lasers have different frequencies.

14. The sensor receiver of claim 12, wherein each of the plurality of excitation lasers comprises a continuous laser.

15. The sensor receiver of claim 12, wherein the probe source comprises a beam splitter downstream from the pulse shaper, and a respective optical delay element in a path of each beam downstream from the beam splitter.

16. The sensor receiver of claim 15, wherein each optical delay element comprises a respective different length of optical fiber.

17. The sensor receiver of claim 12, comprising a first microlens adjacent a first side of the Rydberg cell, and a second microlens adjacent a second side of the Rydberg cell.

18. The sensor receiver of claim 12, comprising a controller coupled to the Rydberg cell, probe source, plurality of excitation lasers, and detector.

19. The sensor receiver of claim 12, wherein the plurality of excitation sources are coupled to the Rydberg cell in at least one of a counter-propagating direction and co-propagating direction from the probe source.

20. A method for receiving a radio frequency (RF) signal comprising:

exposing a Rydberg cell to the RF signal;

operating a probe source to generate a plurality of spaced apart pulsed probe beams within the Rydberg cell, with the pulsed probe beams being offset in time from one another;

operating a plurality of excitation sources coupled to the Rydberg cell; and operating a detector downstream from the Rydberg cell.

21. The method of claim 20, wherein the plurality of excitation sources comprise a plurality of excitation lasers.

22. The method of claim 21, wherein the plurality of excitation lasers have different frequencies.

23. The method of claim 21, wherein each of the plurality of excitation lasers comprises a continuous laser.

24. The method of claim 20, comprising generating the plurality of spaced apart pulsed probe beams without scanning.

25. The method of claim 20, wherein the probe source comprises an optical source, a pulse shaper downstream from the optical source, a beam splitter downstream from the pulse shaper, and a respective optical delay element in a path of each beam downstream from the beam splitter.

26. The method of claim 20, wherein the plurality of excitation sources are coupled to the Rydberg cell in at least one of a counter-propagating direction and co-propagating direction from the probe source.

* * * * *